(12) United States Patent
Madajian

(10) Patent No.: US 11,189,558 B2
(45) Date of Patent: Nov. 30, 2021

(54) PROCESS TO YIELD ULTRA-LARGE INTEGRATED CIRCUITS AND ASSOCIATED INTEGRATED CIRCUITS

(71) Applicant: Raytheon Company, Waltham, MA (US)

(72) Inventor: David Madajian, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/789,210

(22) Filed: Feb. 12, 2020

(65) Prior Publication Data

US 2021/0249346 A1 Aug. 12, 2021

(51) Int. Cl.
*H01L 23/522* (2006.01)
*H01L 21/768* (2006.01)
*H01L 23/532* (2006.01)

(52) U.S. Cl.
CPC ........ *H01L 23/522* (2013.01); *H01L 21/7682* (2013.01); *H01L 21/76801* (2013.01); *H01L 21/76816* (2013.01); *H01L 21/76832* (2013.01); *H01L 21/76837* (2013.01); *H01L 23/5226* (2013.01); *H01L 23/53295* (2013.01)

(58) Field of Classification Search
CPC ............. H01L 23/522; H01L 21/76801; H01L 21/7682; H01L 21/76832; H01L 21/76837; H01L 21/76838; H01L 23/53295; H01L 23/5226; H01L 21/76816
See application file for complete search history.

(56) References Cited

U.S. PATENT DOCUMENTS

| | | | |
|---|---|---|---|
| 5,308,741 A | 5/1994 | Kemp | |
| 5,523,616 A | 6/1996 | Den | |
| 6,136,517 A | 10/2000 | Fletcher | |
| 2002/0038910 A1 | 4/2002 | Inoue et al. | |
| 2008/0164614 A1 | 7/2008 | Ito et al. | |
| 2011/0241184 A1 | 10/2011 | Han et al. | |
| 2015/0287676 A1* | 10/2015 | Rha | H01L 23/53266 257/773 |

(Continued)

FOREIGN PATENT DOCUMENTS

JP S62242331 A 10/1987

OTHER PUBLICATIONS

Stapper et al., "Integrated Circuit Yield Statistics", Proceedings of the IEEE, vol. 71, No. 4, Apr. 1983, p. 453-470.

(Continued)

*Primary Examiner* — Thanhha S Pham

(57) ABSTRACT

An integrated circuit includes a first conductive layer and a first insulation layer formed on the first conductive layer. The integrated circuit also includes a second insulation layer formed on the first insulation layer and a second conductive layer formed on the second insulation layer. The first insulation layer may include a first defect, and the second insulation layer may include a second defect. The integrated circuit may also include a third insulation layer formed on the second conductive layer, a fourth insulation layer formed on the third insulation layer, and a third conductive layer formed on the fourth insulation layer. The third insulation layer may include a third defect, and the fourth insulation layer may include a fourth defect.

20 Claims, 4 Drawing Sheets

(56) References Cited

U.S. PATENT DOCUMENTS

2016/0254227 A1  9/2016  Leobandung
2020/0043857 A1  2/2020  Suzumura et al.

OTHER PUBLICATIONS

Wikipedia, "Design for manufacturability", Jul. 2019, 7 pages.
International Search Report dated Feb. 2, 2021 in connection with International Patent Application No. PCT/US2020/053661, 4 pages.
Written Opinion of the International Searching Authority dated Feb. 2, 2021 in connection with International Patent Application No. PCT/US2020/053661, 6 pages.

* cited by examiner

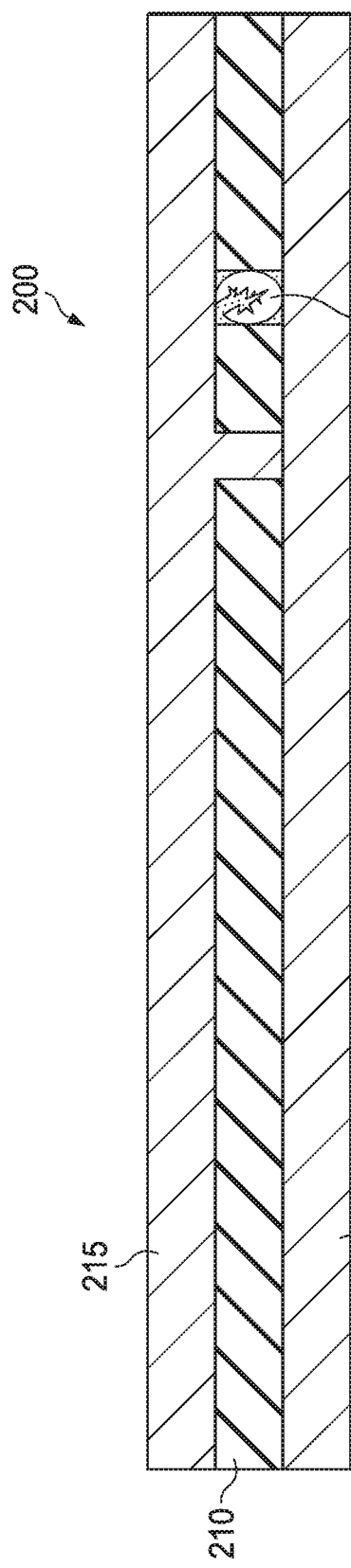
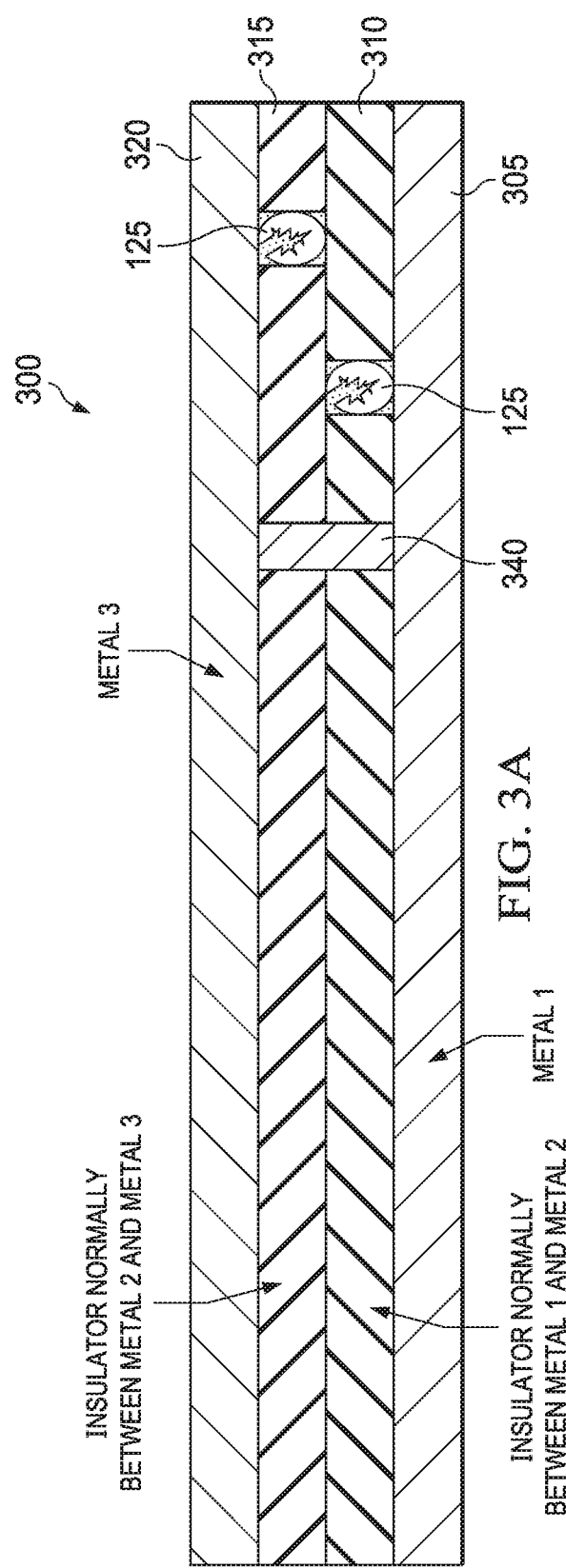

PROCESS TO YIELD ULTRA-LARGE INTEGRATED CIRCUITS AND ASSOCIATED INTEGRATED CIRCUITS

TECHNICAL FIELD

This disclosure is directed in general to integrated circuits. More specifically, this disclosure relates to a process to yield ultra-large integrated circuits and associated integrated circuits.

BACKGROUND

Many modern commercial integrated circuit processes have six or more layers of metal with electrically-insulative layers separating adjacent metal layers. However, all manufacturing processes are imperfect, and various defects can appear in various layers of the integrated circuits. Depending on the type of defect, a defect may prevent proper operation of an integrated circuit or shorten an operational lifespan of the integrated circuit. In some manufacturing processes, a typical defect rate can be one defect per 0.5 square centimeters per layer of material.

SUMMARY

This disclosure provides a process to yield ultra-large integrated circuits and associated integrated circuits.

In a first embodiment, an integrated circuit includes a first conductive layer and a first insulation layer formed on the first conductive layer. The integrated circuit also includes a second insulation layer formed on the first insulation layer and a second conductive layer formed on the second insulation layer.

In some embodiments, the first insulation layer includes a first defect, and the second insulation layer includes a second defect. In particular embodiments, the first defect and the second defect are not aligned between the first conductive layer and the second conductive layer in a manner to expose the first conductive layer to the second conductive layer through the first defect and the second defect. In other particular embodiments, the first defect extends from the first conductive layer to the second insulation layer in a manner to expose the first conductive layer to the second insulation layer. In still other particular embodiments, the second defect extends from the first insulation layer to the second conductive layer in a manner to expose the first insulation layer to the second conductive layer.

In some embodiments, an area for each of the first conductive layer and the second conductive layer is equal to or greater than sixty four square centimeters.

In some embodiments, the first insulation layer and the second insulation layer are separately formed.

In some embodiments, the integrated circuit also includes a third insulation layer formed on the second conductive layer, a fourth insulation layer formed on the third insulation layer, and a third conductive layer formed on the fourth insulation layer. In particular embodiments, the third insulation layer includes a third defect, and the fourth insulation layer includes a fourth defect. Also, in particular embodiments, the third defect and the fourth defect are not aligned between the second conductive layer and the third conductive layer in a manner to expose the second conductive layer to the third conductive layer through the third defect and the fourth defect.

In a second embodiment, a method includes forming a first insulation layer on a first conductive layer and forming a second insulation layer on the first insulation layer. The method also includes forming a second conductive layer on the second insulation layer.

In some embodiments, the first insulation layer includes a first defect, and the second insulation layer includes a second defect. In particular embodiments, the first defect and the second defect are not aligned between the first conductive layer and the second conductive layer in a manner to expose the first conductive layer to the second conductive layer through the first defect and the second defect. In other particular embodiments, the first defect extends from the first conductive layer to the second insulation layer in a manner to expose the first conductive layer to the second insulation layer. In still other particular embodiments, the second defect extends from the first insulation layer to the second conductive layer in a manner to expose the first insulation layer to the second conductive layer.

In some embodiments, an area for each of the first conductive layer and the second conductive layer is equal to or greater than sixty four square centimeters.

In some embodiments, the first insulation layer and the second insulation layer are separately formed.

In some embodiments, the method further includes forming a third insulation layer on the second conductive layer, forming a fourth insulation layer on the third insulation layer, and forming a third conductive layer on the fourth insulation layer. In particular embodiments, the third insulation layer includes a third defect, and the fourth insulation layer includes a fourth defect. Also, in particular embodiments, the third defect and the fourth defect are not aligned between the second conductive layer and the third conductive layer in a manner to expose the second conductive layer to the third conductive layer through the third defect and the fourth defect.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which:

FIG. 2 illustrates an example defective integrated circuit according to this disclosure;

FIGS. 3A and 3B illustrate examples of large integrated circuits according to this disclosure.

DETAILED DESCRIPTION

FIGS. 1A through 4, described below, and the various embodiments used to describe the principles of the present disclosure in this patent document are by way of illustration only and should not be construed in any way to limit the scope of the disclosure. Those skilled in the art will understand that the principles of the present disclosure may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure.

More and more often, integrated circuits need to be fabricated in larger and larger sizes. For example, the demand to build ultra-large imagers, memories, processors, etc. is increasing the need to build integrated circuits that are ultra-large in size. As a particular example, ultra-large integrated circuits can be one thousand times larger or more than typical integrated circuits. Unfortunately, as noted above, all integrated circuit manufacturing processes are imperfect, and various defects can appear in various layers of integrated circuits. In some manufacturing processes, a typical defect rate can be one defect per 0.5 square centimeters per layer of material. As a result, manufacturing processes for ultra-large integrated circuits often have yields that are extremely low, since yield loss is exponentially-related to integrated circuit area. For instance, yields of integrated circuits that are eight centimeters square (sixty four square centimeters) are often only around 1%. Typical attempts to solve this problem involve relaxing design rules, such as metal spacing rules. While this can help to reduce or prevent short-circuits within layers, this does nothing for short-circuits between layers.

This disclosure provides various processes that can be used to yield ultra-large integrated circuits, as well as the associated integrated circuits. As described in more detail below, multiple insulation layers may be used between adjacent conductive layers. Since defects can form randomly in the insulation layers, the likelihood of a defect in one insulation layer overlapping a defect in another insulation layer can be extremely small. As a result, it is far less likely that defects in the multiple insulation layers allow short-circuits to form between the conductive layers. In this way, larger integrated circuits can be manufactured with significantly improved yields. Also note that the term "integrated circuit" is used here merely for simplicity, and this term could correspond to any imagers, memories, processors, etc.

Figure 1A:
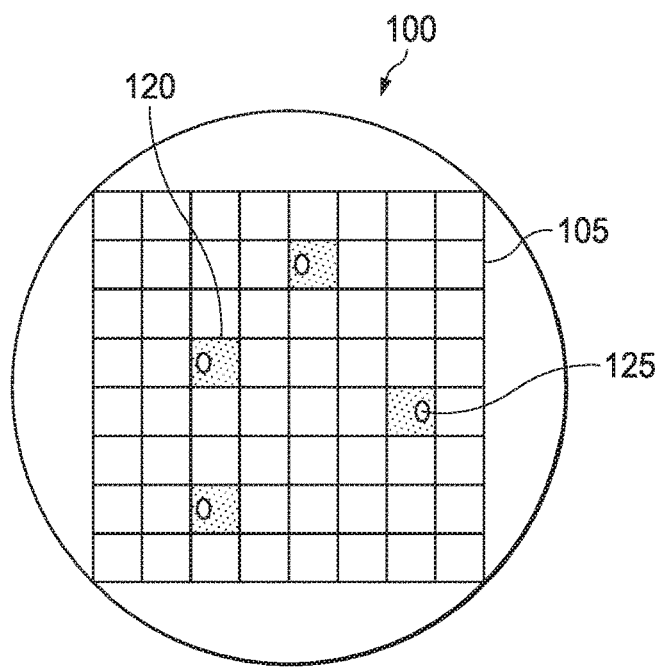
FIGS. 1A, 1B, and 1C illustrate example effects of defects on semiconductor wafers based on a size of an integrated circuit according to this disclosure.
Figure 1B:
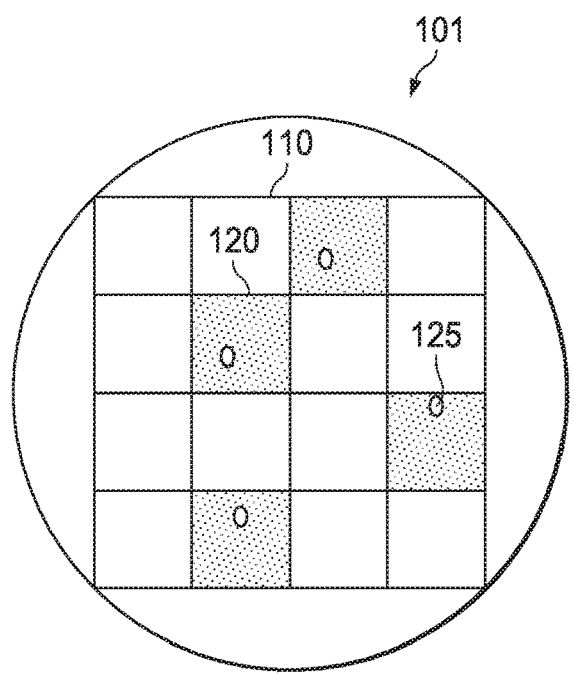
Figure 1C:
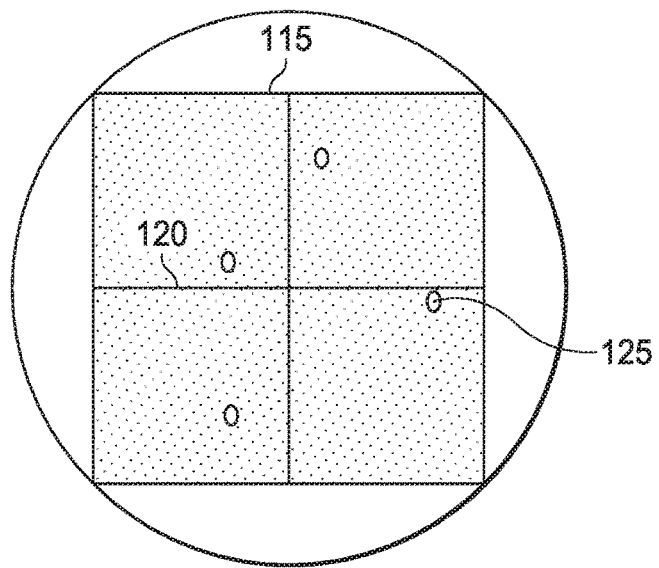

FIGS. 1A, 1B, and 1C illustrate example effects of defects on semiconductor wafers 100-102 based on a size of an integrated circuit according to this disclosure. More specifically, FIG. 1A illustrates an example semiconductor wafer 100 with "small" integrated circuits 105, FIG. 1B illustrates an example semiconductor wafer 101 with "medium" integrated circuits 110, and FIG. 1C illustrates an example semiconductor wafer 102 with "large" integrated circuits 115. Note that the embodiments of the semiconductor wafers 100-102 illustrated in FIGS. 1A, 1B, and 1C are for illustration only, and the sizes, numbers, and arrangements of integrated circuits on semiconductor wafers can vary widely. Thus, FIGS. 1A, 1B, and 1C do not limit the scope of this disclosure to any particular implementation of a semiconductor wafer.

Because of the small size of transistors, conductive traces, and other components of integrated circuits (often having sub-micron sizes), integrated circuit processing is very vulnerable to particles or dust, which is why the integrated circuits are often manufactured in "clean rooms." However, no clean room (not even a "class 10" clean room) is perfect, and all semiconductor wafers typically have one or more defects. A "class 10" clean room is defined as a clean room having less than ten particles having a size of more than 0.5 microns within a cubic foot of air.

All of the semiconductor wafers 100-102 shown in FIGS. 1A, 1B, and 1C contain similar defects 125 for illustrative purposes. Note that both the numbers and the locations of the defects 125 in any given semiconductor wafer can vary. Also note that the terms "small," "medium," and "large" are used here merely for illustrative purposes in order to demonstrate issues with increasing the size of integrated circuits, and these terms do not correspond to any specific sizes or size ranges of integrated circuits.

As shown in FIGS. 1A, 1B, and 1C, the semiconductor wafer 100 is made of or includes small integrated circuits 105, the semiconductor wafer 101 is made of or includes medium integrated circuits 110, and the semiconductor wafer 102 is made of or includes large integrated circuits 115. When four defects 125 randomly occur on a semiconductor wafer, the size of the integrated circuits has a drastic effect on the success of formation. In these examples, for instance, the semiconductor wafer 100 has four small integrated circuits 105 that are defective and sixty small integrated circuits 105 that are acceptable, which is a 94% success rate or yield. The semiconductor wafer 101 has four medium integrated circuits 110 that are defective and twelve medium integrated circuits 110 that are acceptable, which is a 75% success rate or yield. The semiconductor wafer 102 has four large integrated circuits 115 that are defective and zero large integrated circuits 115 that are acceptable, which is a 0% success rate or yield. As a result, the success rate of the integrated circuits decreases, typically at an exponential level, as the size of the integrated circuits increases.

Although FIGS. 1A, 1B, and 1C illustrate examples of effects of defects on semiconductor wafers 100-102 based on a size of an integrated circuit, various changes may be made to FIGS. 1A, 1B, and 1C. For example, a semiconductor wafer may have any suitable number of integrated circuits in any suitable arrangement, and the integrated circuits on the semiconductor wafer may or may not be identical.

FIG. 2 illustrates an example defective integrated circuit 200 according to this disclosure. Note that the embodiment of the defective integrated circuit 200 illustrated in FIG. 2 is for illustration only. FIG. 2 does not limit the scope of this disclosure to any particular implementation of an integrated circuit.

As shown in FIG. 2, the defective integrated circuit 200 includes a first conductive layer 205, an insulation layer 210, and a second conductive layer 215. In some embodiments, the first conductive layer 205 can be formed on a semiconductor substrate, such as a silicon or other substrate. The insulation layer 210 can be formed on the first conductive layer 205, and the second conductive layer 215 can be formed on the insulation layer 210. The first and second conductive layers 205 and 215 are typically etched or otherwise processed to form electrical components, electrically conductive traces, or other features of an integrated circuit. The insulation layer 210 can also be etched so that conductive vias or other electrical connections can be formed through the insulation layer 210 between the first and second conductive layers 205 and 215 in desired locations.

Unfortunately, the insulation layer 210 here can include a number of defects 125. The defects 125 can cause exposure to the adjacent conductive layers 205 and 215, meaning each defect 125 may provide a pathway for a short-circuit to occur between the conductive layers 205 and 215 in undesired locations. For example, a defect 125 might allow metal from the second conductive layer 215 to pass through the insulation layer 210 in an undesired location and form an undesired electrical connection to the first conductive layer

205. These types of defects 125 can therefore result in a defective integrated circuit 200.

Each defect 125 can be defined as a void that extends through an insulation layer from a first adjacent layer (such as the first conductive layer 205) to a second adjacent layer (such as the second conductive layer 215) in a manner that exposes the first adjacent layer to the second adjacent layer. When the first conductive layer 205 is exposed to the second conductive layer 215, a short-circuit develops between the layers 205 and 215, producing a defective integrated circuit 200. The chances of creating a faulty integrated circuit increase both (i) as the size of the integrated circuit increases and (ii) as the number of conductive layers increase (since this also increases the number of insulation layers). In either case, there is a higher likelihood of a defect 125 being formed that prevents proper operation of the integrated circuit, which is why yields associated with large integrated circuits is so low.

Although FIG. 2 illustrates one example of a defective integrated circuit 200, various changes may be made to FIG. 2. For example, FIG. 2 is merely meant to illustrate one example way in which a defect 125 might interfere with proper operation of the integrated circuit 200.

Figure 3B:
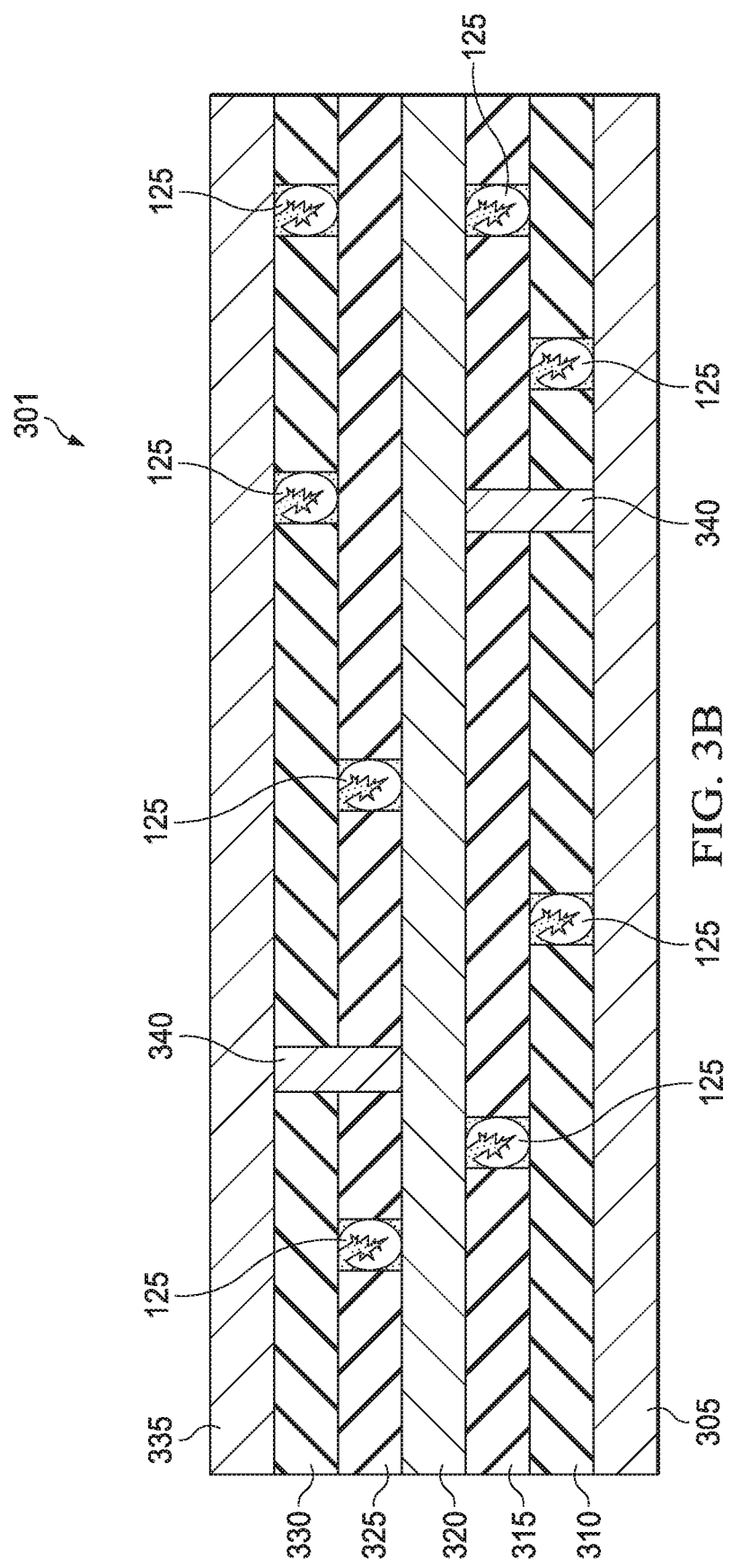

FIGS. 3A and 3B illustrate examples of large integrated circuits 300 and 301 according to this disclosure. More specifically, FIG. 3A illustrates an example four-layer integrated circuit 300, and FIG. 3B illustrates an example seven-layer integrated circuit 301. Note that the embodiments of the large integrated circuits 300-301 illustrated in FIGS. 3A and 3B are for illustration only. FIGS. 3A and 3B do not limit the scope of this disclosure to any particular implementation of an integrated circuit.

Many analog core architectures implemented in integrated circuits can be realized with only two or three conductive layers. Using every other layer of conductive material would allow two independent layers of electrically-insulative material to be used between each conductive layer. Since the probability of a defect occurring in both insulating layers at exactly the same location would be extremely small, this can significantly reduce the likelihood of defects allowing a short-circuit to form between the conductive layers. Thus, this technique can greatly improve product yields in integrated circuit manufacturing processes. Note that by using every other layer of conductive material in a structure can sacrifice half of the available routing layers, but it can significantly reduce short-circuits between layers and improve manufacturing yields.

As shown in FIG. 3A, the four-layer integrated circuit 300 includes a first conductive layer 305, a first insulation layer 310, a second insulation layer 315, a second conductive layer 320. The first conductive layer 305 can be formed on a silicon substrate or other semiconductor substrate. The first conductive layer 305 can be formed from any suitable conductive material or materials, such as one or more metals. The first conductive layer 305 can also be formed in any suitable manner, such as physical vapor deposition or chemical vapor deposition.

The first insulation layer 310 is formed on the first conductive layer 305, possibly without any intervening layers. The second insulation layer 315 is formed on the first insulation layer 310, again possibly without any intervening layers. Each of the first and second insulation layers 310 and 315 can be formed from any suitable electrically-insulative material or materials, such as one or more dielectrics. Each of the first and second insulation layers 310 and 315 can also be formed in any suitable manner, such as physical vapor deposition or chemical vapor deposition.

In some embodiments, unused conductive layers can be implemented to strengthen connections between used conductive layers. In this case, each unused conductive layer would act as a plug. Note that "unused" conductive layers can still be used in the peripheral support circuits. As an example, an imager includes a pixel area that vastly dominates the area in the integrated circuit 300 and components outside of the pixel area could include the conductive layers not used for the pixel area. The peripheral support circuits for the integrated circuit 300 often can include components, such as digital control circuits and analog to digital converters, that typically need all the conductive layers.

In particular embodiments, there is a minimum metal density to be adhered to, and fill metal is added in the otherwise unused layers. The fill metal includes small pieces of floating metal and does not adversely impact yield, since continuous metal would be needed for a short-circuit to form. Typically, this is done by the foundry manufacturing the integrated circuit.

The second conductive layer 320 is formed on the second insulation layer 315, again possibly without any intervening layers. The second conductive layer 320 can be formed from any suitable conductive material or materials, such as one or more metals. The second conductive layer 320 can also be formed in any suitable manner, such as physical vapor deposition or chemical vapor deposition. The second conductive layer 320 can be electrically connected to the first conductive layer 305 through the first insulation layer 310 and the second insulation layer 315 by one or more vias 340. Each via 340 can be formed in any suitable manner, such as by etching openings through the first insulation layer 310 and the second insulation layer 315 and depositing one or more conductive materials in the etched opening(s).

As can be seen in FIG. 3A, defects 125 in the first insulation layer 310 and the second insulation layer 315 can still exist, since eliminating such defects 125 may be impractical or impossible to eliminate. However, the likelihood of a defect 125 in the first insulation layer 310 overlapping a defect 125 in the second insulation layer 315 can be extremely small since the defects 125 are formed randomly. This helps to reduce or prevent short-circuits between the first and second conductive layers 305 and 320, even in the presence of a large number of defects 125.

As shown in FIG. 3B, the seven-layer integrated circuit 301 includes the first conductive layer 305, the first insulation layer 310, the second insulation layer 315, and the second conductive layer 320. In addition, the integrated circuit 301 includes a third insulation layer 325, a fourth insulation layer 330, and a third conductive layer 335.

The third insulation layer 325 is formed on the second conductive layer 320, possibly without any intervening layers. The fourth insulation layer 330 is formed on the third insulation layer 325, again possibly without any intervening layers. Each of the third and fourth insulation layers 325 and 330 can be formed from any suitable electrically-insulative material or materials, such as one or more dielectrics. Each of the third and fourth insulation layers 325 and 330 can also be formed in any suitable manner, such as physical vapor deposition or chemical vapor deposition.

The third conductive layer 335 is formed on the fourth insulation layer 330, again possibly without any intervening layers. The third conductive layer 335 can be formed from any suitable conductive material or materials, such as one or more metals. The third conductive layer 335 can also be formed in any suitable manner, such as physical vapor deposition or chemical vapor deposition. The third conductive layer 335 can be electrically connected to the second conductive layer 320 through the third insulation layer 325 and the fourth insulation layer 330 by one or more vias 340. Each via 340 can be formed in any suitable manner, such as by etching openings through the third insulation layer 325 and the fourth insulation layer 330 and depositing one or more conductive materials in the etched opening(s).

As can be seen in FIG. 3B, defects 125 in the first insulation layer 310, second insulation layer 315, third insulation layer 325, and fourth insulation layer 330 can still exist, since eliminating such defects 125 may be impractical or impossible to eliminate. However, the likelihood of a defect 125 in the first insulation layer 310 overlapping a defect 125 in the second insulation layer 315 can be extremely small since the defects 125 are formed randomly, and the likelihood of a defect 125 in the third insulation layer 325 overlapping a defect 125 in the fourth insulation layer 330 can be extremely small since the defects 125 are formed randomly. This helps to reduce or prevent short-circuits between the first and second conductive layers 305 and 320 and between the second and third conductive layers 320 and 335, even in the presence of a large number of defects 125.

In some embodiments, each of the layers in the four-layer integrated circuit 300 and the seven-layer integrated circuit 301 can have an area that is equal to or greater than 64 cm$^2$. In situations where only a single insulation layer is used between adjacent conductive layers, the success rate of manufacturing an integrated circuit at these dimensions nearly reaches 0%. Using multiple insulation layers between adjacent conductive layers can help to increase the success rate of manufacturing an integrated circuit at these dimensions significantly, such as to greater than 90%. This can apply for both the four-layer integrated circuit 300 and the seven-layer integrated circuit 301.

Although FIGS. 3A and 3B illustrate examples of large integrated circuits 300 and 301, various changes may be made to FIGS. 3A and 3B. For example, more than two insulation layers may be used between adjacent conductive layers. Also, more than two conductive layers may be used in an integrated circuit 300 and 301. In addition, the relative sizes, shapes, and dimensions of the components of the integrated circuits 300 and 301 may vary as needed or desired.

Figure 4:
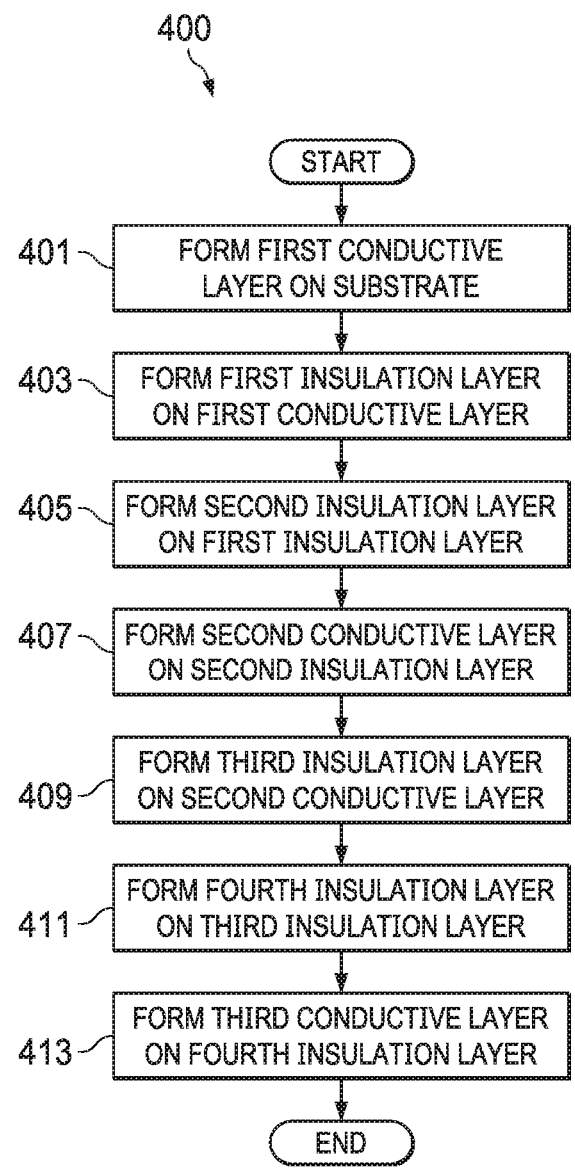
FIG. 4 illustrates an example method for producing large integrated circuits according to this disclosure.

FIG. 4 illustrates an example method 400 for producing large integrated circuits according to this disclosure. For ease of explanation, the method 400 is described as being performed to produce the seven-layer integrated circuit 301 of FIG. 3B. However, the method 400 can be used to produce other multi-layer integrated circuits, such as the four-layer integrated circuit 300 of FIG. 3A.

As shown in FIG. 4, a first conductive layer is formed on a semiconductor substrate at step 401. This may include, for example, depositing the first conductive layer 305 on a silicon substrate or other semiconductor substrate. The first conductive layer 305 can include any suitable conductive material(s), such as one or more metals, and can be formed in any suitable manner. In some embodiments, the area of the first conductive layer 305 can be equal to or greater than 64 cm$^2$.

A first insulation layer is formed on the first conductive layer at step 403. This may include, for example, forming the first insulation layer 310 directly on the first conductive layer 305 without any intervening layers. The first insulation layer 310 can include any suitable electrically-insulative material(s), such as one or more dielectric materials, and can be formed in any suitable manner. In some embodiments, the area of the first insulation layer 310 can be equal to or greater than 64 cm$^2$. The first insulation layer 310 can include one or more defects 125, which represent voids that expose the first conductive layer 305 through the first insulation layer 310.

A second insulation layer is formed on the first insulation layer at step 405. This may include, for example, forming the second insulation layer 315 directly on the first insulation layer 310 without any intervening layers. The second insulation layer 315 can include any suitable electrically-insulative material(s), such as one or more dielectric materials, and can be formed in any suitable manner. In some embodiments, the area of the second insulation layer 315 can be equal to or greater than 64 cm$^2$. The second insulation layer 315 can include one or more defects 125, which represent voids that expose the first insulation layer 310 through the second insulation layer 315. However, the probability of a defect 125 in the first insulation layer 310 aligning with a defect 125 in the second insulation layer 315 can be extremely small, making it highly unlikely that defects in both the first and second insulation layers 310 and 315 would expose part of the first conductive layer 305.

A second conductive layer is formed on the second insulation layer at step 407. This may include, for example, depositing the second conductive layer 320 on the second insulation layer 315 without any intervening layers. The second conductive layer 320 can include any suitable conductive material(s), such as one or more metals, and can be formed in any suitable manner. In some embodiments, the area of the second conductive layer 320 can be equal to or greater than 64 cm$^2$. The second conductive layer 320 can be connected to the first conductive layer 305, such as by using one or more vias 340 formed through the first insulation layer 310 and the second insulation layer 315.

A third insulation layer is formed on the second conductive layer at step 409. This may include, for example, forming the third insulation layer 325 directly on the second conductive layer 320 without any intervening layers. The third insulation layer 325 can include any suitable electrically-insulative material(s), such as one or more dielectric materials, and can be formed in any suitable manner. In some embodiments, the area of the third insulation layer 325 can be equal to or greater than 64 cm$^2$. The third insulation layer 325 can include one or more defects 125, which represent voids that expose the second conductive layer 320 through the third insulation layer 325.

A fourth insulation layer is formed on the third insulation layer at step 411. This may include, for example, forming the fourth insulation layer 330 directly on the third insulation layer 325 without any intervening layers. The fourth insulation layer 330 can include any suitable electrically-insulative material(s), such as one or more dielectric materials, and can be formed in any suitable manner. In some embodiments, the area of the fourth insulation layer 330 can be equal to or greater than 64 cm$^2$. The fourth insulation layer 330 can include one or more defects 125, which represent voids that expose the third insulation layer 325 through the fourth insulation layer 330. However, the probability of a defect 125 in the third insulation layer 325 aligning with a defect 125 in the fourth insulation layer 330 can be extremely small, making it highly unlikely that defects in both the third and fourth insulation layers 325 and 330 would expose part of the second conductive layer 320.

A third conductive layer is formed on the fourth insulation layer at step 413. This may include, for example, depositing the third conductive layer 335 on the fourth insulation layer 330 without any intervening layers. The third conductive layer 335 can include any suitable conductive material(s), such as one or more metals, and can be formed in any suitable manner. In some embodiments, the area of the third conductive layer 335 can be equal to or greater than 64 cm². The third conductive layer 335 can be connected to the second conductive layer 320, such as by using one or more vias 340 formed through the third insulation layer 325 and the fourth insulation layer 330.

Although FIG. 4 illustrates one example of a method 400 for producing large integrated circuits, various changes may be made to FIG. 4. For example, while shown as a series of steps, various steps shown in FIG. 4 may overlap, occur in parallel, occur in a different order, or occur multiple times. Moreover, some steps may be combined, further subdivided, or removed and additional steps may be added according to particular needs.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," or "system" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An integrated circuit comprising:
a first conductive layer;
a first insulation layer formed on the first conductive layer;
a second insulation layer formed on the first insulation layer; and
a second conductive layer formed on the second insulation layer;
wherein the first insulation layer includes a first defect exposing the first conductive layer to the second insulation layer, and
wherein the second insulation layer includes a second defect exposing the first insulation layer to the second conductive layer.

2. The integrated circuit of claim 1, wherein the first defect and the second defect are not aligned between the first conductive layer and the second conductive layer to avoid exposing the first conductive layer to the second conductive layer through the first defect and the second defect.

3. The integrated circuit of claim 1, wherein the first defect extends from the first conductive layer to the second insulation layer to expose the first conductive layer to the second insulation layer.

4. The integrated circuit of claim 1, wherein the second defect extends from the first insulation layer to the second conductive layer to expose the first insulation layer to the second conductive layer.

5. The integrated circuit of claim 1, wherein an area for each of the first conductive layer and the second conductive layer is equal to or greater than 64 cm².

6. The integrated circuit of claim 1, wherein the first insulation layer and the second insulation layer are separately formed.

7. The integrated circuit of claim 1, further comprising:
a third insulation layer formed on the second conductive layer;
a fourth insulation layer formed on the third insulation layer; and
a third conductive layer formed on the fourth insulation layer.

8. The integrated circuit of claim 7, wherein:
the third insulation layer includes a third defect exposing the second conductive layer to the fourth insulation layer; and
the fourth insulation layer includes a fourth defect exposing the third insulation layer to the third conductive layer.

9. The integrated circuit of claim 8, wherein the third defect and the fourth defect are not aligned between the second conductive layer and the third conductive layer to avoid exposing the second conductive layer to the third conductive layer through the third defect and the fourth defect.

10. The integrated circuit of claim 1, wherein the second conductive layer is formed directly on the second insulating layer.

11. A method for forming an integrated circuit comprising:
forming a first insulation layer on a first conductive layer;
forming a second insulation layer directly on the first insulation layer; and
forming a second conductive layer on the second insulation layer;
wherein the first insulation layer includes a first defect exposing the first conductive layer to the second insulation layer, and
wherein the second insulation layer includes a second defect exposing the first insulation layer to the second conductive layer.

12. The method of claim 11, wherein the first defect and the second defect are not aligned between the first conductive layer and the second conductive layer to avoid exposing the first conductive layer to the second conductive layer through the first defect and the second defect.

13. The method of claim 11, wherein the first defect extends from the first conductive layer to the second insulation layer to expose the first conductive layer to the second insulation layer.

14. The method of claim 11, wherein the second defect extends from the first insulation layer to the second conductive layer to expose the first insulation layer to the second conductive layer.

15. The method of claim 11, wherein an area for each of the first conductive layer and the second conductive layer is equal to or greater than 64 cm$^2$.

16. The method of claim 11, wherein the first insulation layer and the second insulation layer are separately formed.

17. The method of claim 11, further comprising:
   forming a third insulation layer on the second conductive layer;
   forming a fourth insulation layer on the third insulation layer; and
   forming a third conductive layer on the fourth insulation layer.

18. The method of claim 17, wherein:
   the third insulation layer includes a third defect exposing the second conductive layer to the fourth insulation layer; and
   the fourth insulation layer includes a fourth defect exposing the third insulation layer to the third conductive layer.

19. The method of claim 18, wherein the third defect and the fourth defect are not aligned between the second conductive layer and the third conductive layer to avoid exposing the second conductive layer to the third conductive layer through the third defect and the fourth defect.

20. The method of claim 11, wherein the second conductive layer is formed directly on the second insulating layer.

* * * * *